US007012943B2

(12) United States Patent
Tran et al.

(10) Patent No.: US 7,012,943 B2
(45) Date of Patent: Mar. 14, 2006

(54) INTEGRATION OF AMORPHOROUS SILICON TRANSMIT AND RECEIVE STRUCTURES WITH GAAS OR INP PROCESSED DEVICES

(75) Inventors: Dean Tran, Westminster, CA (US); Eric R. Anderson, Fremont, CA (US); George J. Vendura, Jr., Los Alamitos, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 143 days.

(21) Appl. No.: 09/894,717

(22) Filed: Jun. 28, 2001

(65) Prior Publication Data

US 2003/0002555 A1 Jan. 2, 2003

(51) Int. Cl.
  *H01S 5/00* (2006.01)

(52) U.S. Cl. .............................. 372/50; 372/43; 372/44; 372/45; 372/46; 372/47; 372/48; 372/49; 372/103

(58) Field of Classification Search ............. 372/43–50, 372/103
See application file for complete search history.

(56) References Cited

U.S. PATENT DOCUMENTS

| 4,982,256 | A | * | 1/1991 | Suzuki ........................ 257/189 |
| 5,038,356 | A |   | 8/1991 | Botez et al. |
| 5,355,096 | A |   | 10/1994 | Kobayashi |
| 5,389,896 | A |   | 2/1995 | Kobayashi |
| 5,398,004 | A |   | 3/1995 | Kobayashi |
| 5,550,520 | A |   | 8/1996 | Kobayashi |
| 5,710,523 | A |   | 1/1998 | Kobayashi |
| 5,719,893 | A | * | 2/1998 | Jiang et al. .................... 372/45 |
| 5,757,834 | A |   | 5/1998 | Fang et al. |
| 5,757,837 | A | * | 5/1998 | Lim et al. ...................... 372/50 |
| 5,838,031 | A |   | 11/1998 | Kobayashi et al. |
| 5,877,519 | A | * | 3/1999 | Jewell ......................... 257/190 |
| 6,023,485 | A |   | 2/2000 | Claisse et al. |
| 6,097,748 | A | * | 8/2000 | Huang et al. .................. 372/50 |
| 6,483,862 | B1 | * | 11/2002 | Aronson et al. ............... 372/50 |
| 6,670,599 | B1 | * | 12/2003 | Wagner et al. ........... 250/214.1 |

FOREIGN PATENT DOCUMENTS

| DE | 198 07 783 A1 | 9/1999 |
| EP | 0 987 800 A1 | 3/2000 |

OTHER PUBLICATIONS

Anders Karlsson et al., Analysis of a VCLAD: Vertical–Cavity Laser Amplifier Detector, IEEE Photonics Technology Letters, Nov. 1995, pp. 1336–1338, vol. 7, No. 11, New York, US.
Sui–F. Lim, et al., Vertical–Cavity Lasers with an Intracavity Resonant Detector, IEEE Journal of Selected Topics in Quantum Electronics, Apr. 1997, pp. 416–420, vol. 3, No. 2.
Copy of International Search Report, Oct. 22, 2003, 3 pages.

* cited by examiner

Primary Examiner—Min Sun Harvey
Assistant Examiner—Delma R. Flores-Ruiz
(74) Attorney, Agent, or Firm—Katten Muchin Rosenman LLP; John S. Paniaguas

(57) ABSTRACT

A device and a process for integrating light energy transmit and/or receive functions with active devices such as GaAs or InP devices or light emitting devices, such as lasers. The device and process includes forming a passivation layer on top of the active device and forming a silicon photodetector on top of the passivation layer. The photodetector may be formed utilizing a standard solar cell growth process and may be formed as a mesa on top of the active or light-emitting device, thus forming a relatively less complicated semiconductor with an integrated monitoring device.

11 Claims, 3 Drawing Sheets

INTEGRATION OF AMORPHOROUS SILICON TRANSMIT AND RECEIVE STRUCTURES WITH GAAS OR INP PROCESSED DEVICES

BACKGROUND OF THE INVENTION

1. Field of the Invention

The present invention relates to a process for semiconductor devices and more particularly to a process for integrating light energy transmit and/or receive functions with existing semiconductor devices, such as GaAs or InP devices.

2. Description of the Prior Art

Various semiconductors are known, such as high-electron mobility transistor (HEMT) and heterojunction bipolar transistor (HBT) active devices as well as light-emitting devices, such as laser diodes, in which it is necessary to monitor performance of the device during operation. For example, for light-emitting devices, such as lasers, performance is normally monitored by way of a photodetector. The photodetector is used to monitor the intensity of the light indicating device. Such photodetectors are known to be fabricated separately and epoxied directly to the light-emitting device. However, such a process is relatively inefficient since it requires separate processing of the photodetector and also requires attaching of the photodetector to the semiconductor device. Such an inefficient process thus increases the cost of devices which require monitoring.

As such, processes have been developed for integrating photodetectors into a light emitting device, such as a laser, for example, as disclosed in U.S. Pat. Nos. 5,757,837 and 6,023,485. However, the integration of the photodetectors into the light-emitting devices as disclosed in these patents involves relatively complicated processes and only provides limited performance. For example, U.S. Pat. No. 5,757,834 discloses a vertical cavity surface emitting laser with an integrally formed photodetector. The photodetector is formed as an intracavity quantum well photodetector, disposed at the optical intensity peak at the Fabry-Perot wavelength. In particular, the laser is formed on a GaN substrate and includes an n-doped distributed Bragg reflector (DBR) mirror stack. An active gain region is formed on top of the n-doped DBR mirror stack and includes a one wavelength spacer and a quantum well stack. A p-doped DBR mirror stack is formed on top of the active gain region. The intracavity quantum well photodetector is formed on top of the p-doped DBR mirror stack and includes a 5λ/4 spacer with an $In_{0.2}Ga_{0.8}As$ quantum well. On top of the photodetector another n-doped DBR mirror stack is formed.

The laser emits light from the underside of the GaAn substrate. Reflected light is sensed by the photodetector to provide an indication of the intensity of the laser light. Although the system disclosed in the '837 patent discloses an integrally-formed photodetector, the processing steps are rather complicated and include the formation of a quantum well sandwiched between two DBRs.

U.S. Pat. No. 6,023,485 also discloses a vertical cavity surface emitting laser diode with an integrated PIN photo diode. In this embodiment, the PIN diode is formed on top of a vertical cavity surface emitting laser. The PIN diode is formed as a lower stack of n-doped DBRs, which are shared with the laser. An intrinsic region and p-doped upper stack of DBRs are formed on top of the PIN diode. Ion implantation is used to damage a portion of the upper stack of DBRs in order to define high resistivity damaged areas to confine the light paths in the region of the upper stack of DBRs. As such, the device is relatively complicated to fabricate. Thus, there is a need for a monitoring device that can be integrated with various active devices that is relatively simpler to fabricate than known devices.

SUMMARY OF THE INVENTION

Briefly, the present invention relates to a process for integrating light energy transmit and/or receive functions with active devices, such as GaAs, GaN or InP, and related devices, or light emitting devices, such as lasers. Briefly, the process includes forming a monitoring device, such as a passivation layer on top of the active or light emitting device and forming a silicon (crystalline or amorphous) photodetector or photodiode on top of the passivation layer. The photodetector/photodiode may be formed utilizing a standard solar cell growth process and may be formed as a mesa on top of the active or light-emitting device, thus forming a relatively less complicated integrated photodetector/photodiode than known devices.

DETAILED DESCRIPTION

The present invention relates to a relatively uncomplicated process for forming one or more monitoring device, such as amorphorous silicon transmit and receive structures on top of active devices, such GaAs, GaN, and InP or related devices, as well as light-emitting devices, such as lasers. An important aspect of the invention is that the light transmit and receive functions can be implemented by way of a relatively simple low-temperature, of amorphous silicon composition deposition process.

In accordance with the present invention, the light energy transmit and receive functions can be integrated on top of active devices, such as GaAs, GaN and InP active, devices, for example, as disclosed in commonly-owned U.S. Pat. Nos. 5,838,031; 5,710,523; 5,550,520; 5,398,004; 5,389,896 and 5,355,096. In particular, the light energy transmit function may be integrally incorporated into a GaAs, GaN or InP active device, such as an amplifier, which would allow visual inspection of the operation of the amplifier connected to the light emitting diode. On the other hand, the light energy receive function may be used to detect light, for example, from light-emitting devices, such as lasers and laser diodes, for example as disclosed in commonly-owned U.S. Pat. No. 5,038,356, to monitor the light intensity of the light-emitting device to provide an indication of the performance light-emitting device.

The present invention is shown and illustrated as being integrated on top of a semiconductor laser diode and more particularly to a vertical cavity surface emitting diode laser (VCSEL), as described in detail in commonly-owned U.S. Pat. No. 5,038,356, hereby incorporated by reference. It is to be understood, however, that the integration process in accordance with the present invention may be utilized with virtually any GaAs or InP active devices, as well as various types of light-emitting devices, to provide additional functionality on a single GaAs, or InP substrate.

Figure 1:
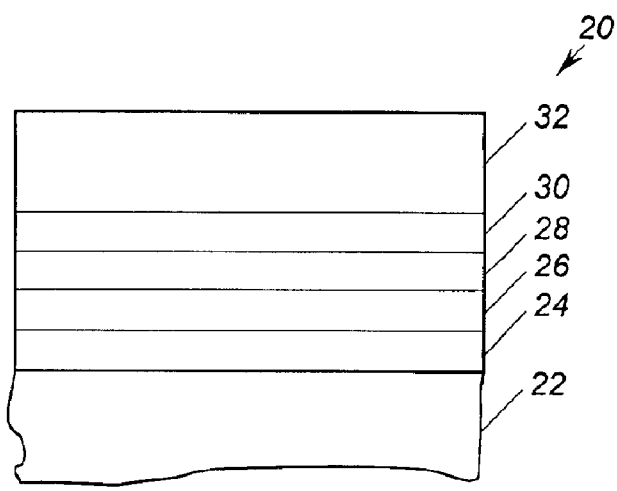
FIG. 1 is a cross-sectional elevational view of an exemplary vertical cavity surface emitting diode laser.

Turning to FIG. 1, the silicon process for forming a light transmitting or light receiving device is shown being formed on top of a vertical cavity surface emitting diode laser described in detail in commonly-owned U.S. Pat. No. 5,038,356, hereby incorporated by reference. Briefly, the VCSEL, generally identified with the reference numeral 20, may be formed by a two-step metal organic chemical vapor deposition (MOCVD) crystal growth process or by molecular beam epitaxy (MBE). As shown, the VCSEL includes a substrate 22, for example, a p-doped InP, GaAs or other substrate. A p-doped semiconductor reflector or distributed Bragg reflector (DBR) 24 is formed on top of the substrate 22. A p-cladding layer 26 is next formed on top of the semiconductor reflector layer 24. The p-cladding layer may be formed of $Al_xAs_{1-x}$. An active layer, formed, for example, from multiple quantum wells, may be disposed between the p-cladding layer 26 and an n-cladding layer 30. A back reflector layer 32 may be formed on top of the n-cladding layer 30.

The front reflector 24 may be distributive Bragg reflector formed from 5 to 10 high/low index pairs for example, or a certain number of pair depending on the light wavelength. The back reflector 32 may be formed from 70 to 100 high/low index pairs for example, or a certain number of pair depending on the light wavelength.

Unlike the VCSEL disclosed in commonly-owned U.S. Pat. No. 5,038,356, the back reflector layer 32 is not formed as a mesa. Rather the back reflector layer 32 is allowed to extend across the surface of the entire device, as generally shown in FIG. 1. The balance of the details for forming the vertical cavity surface emitting diode laser are as generally disclosed in commonly-owned U.S. Pat. No. 5,038,356.

Figure 2:
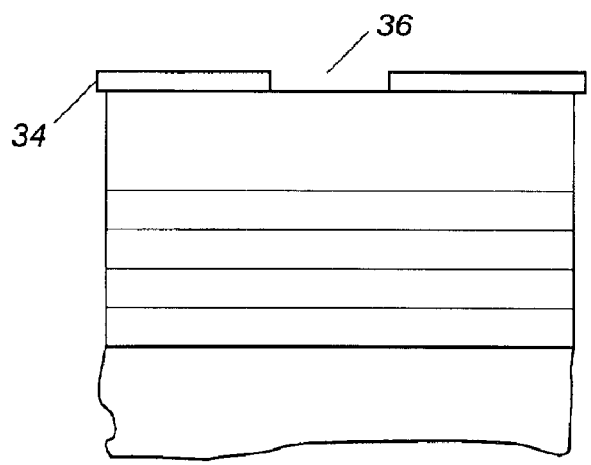
FIG. 2 illustrates the formation of a passivation layer on top of the device illustrated in FIG. 1.

In accordance with an important aspect of the invention, a relatively low temperature, i.e. 250° C.–550° C., silicon dioxide or silicon nitride passivation layer 34 is formed on top of the VCSEL 20 by low pressure chemical vapor deposition (LPCVD). A window 36 (FIG. 2) is etched through passivation layer 34 to enable the photodetector to detect reflected light, as will be discussed in more detail below. The window 36 may be formed by masking the window 36 by standard photolithographic techniques and dry etching to remove that portion of the passivation layer 34 to form the window 36. The dry etching may be followed up by a wet etch process to clean passivation material residue from the upper reflector layer 32.

Figure 3:
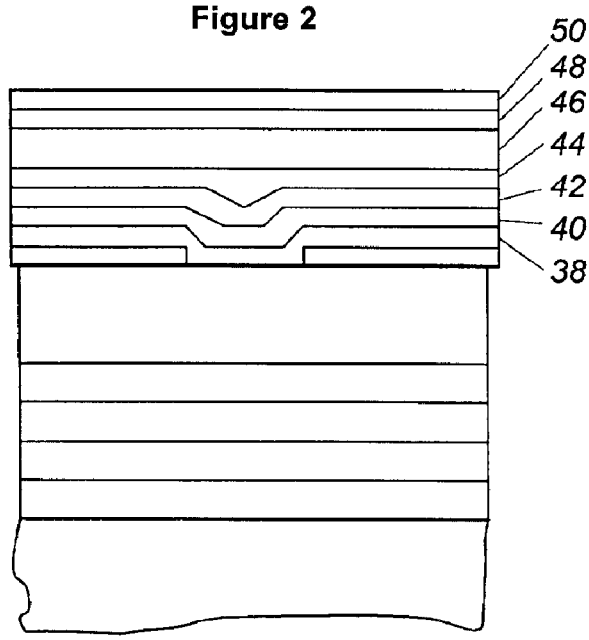
FIG. 3 illustrates the formation of an exemplary silicon photodetector on top of the passivation layer illustrated in FIG. 2.

After the window 36 is formed in the passivation layer 34, the photodetector is formed thereupon. The photodetector may be implemented as a standard solar cell growth process. In particular, referring to FIG. 3, a p-type conductive transparency oxide 38 (CTO) formed from, for example, ZnO having a thickness of, for example, 150 nm is formed on top of the passivation layer 34 and window 36. Another silicon dioxide layer 40 may be formed on top of the CTO layer 38. The silicon dioxide layer 40 may be formed with a thickness of thousand angstroms. A second CTO layer (SnO) Tin Oxide with fluor doped 42 is formed on top of the silicon dioxide layer 40 from ZnO having a thickness of 150 nm.

A p-doped amorphorous silicon material composition layer 44 is formed on top of the second CTO layer 42. The p-doped amorphorous silicon material composition may be formed with a thickness of 10–20 nm. An un-doped amorphorous silicon absorbent layer 46 is sandwiched between the p-doped amorphorous silicon material composition layer 44 and an n-doped amorphorous silicon composition layer 48. The un-doped amorphorous silicon absorbent layer 46 may be formed with a thickness between 200 nm–300 nm. The n-doped amorphorous silicon composition layer 48 may be formed with a thickness of 100 nm–150 nm. Finally, a third CTO layer 50 may be formed on top of the n-doped amorphorous silicon composition layer 48. The third CTO layer 50 is formed from ZnO having a thickness of, for example, 150 nm.

Figure 4:
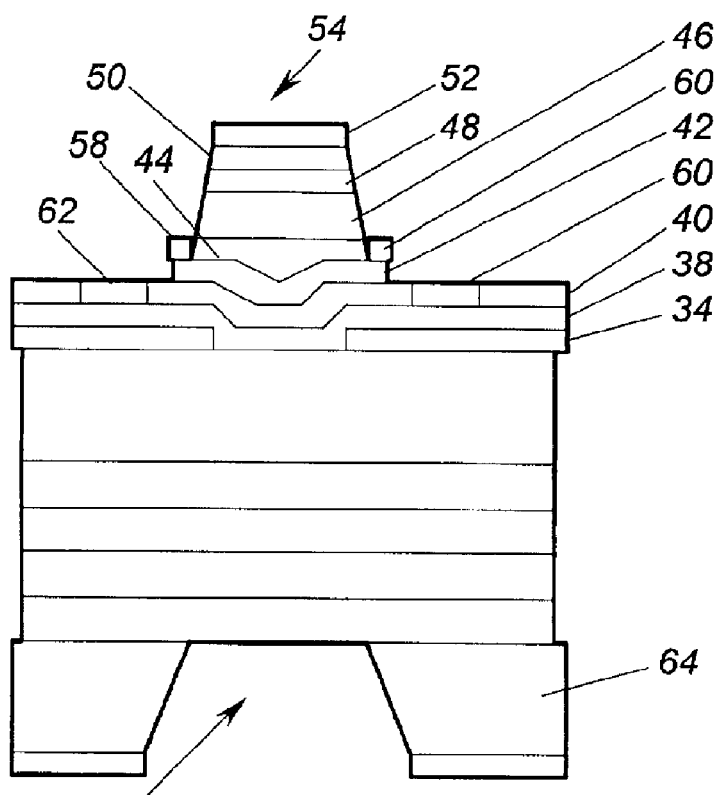
FIG. 4 is a cross-sectional elevational view of a vertical cavity surface emitting diode laser with an integrally formed photodetector in accordance with the present invention.
Figure 5:
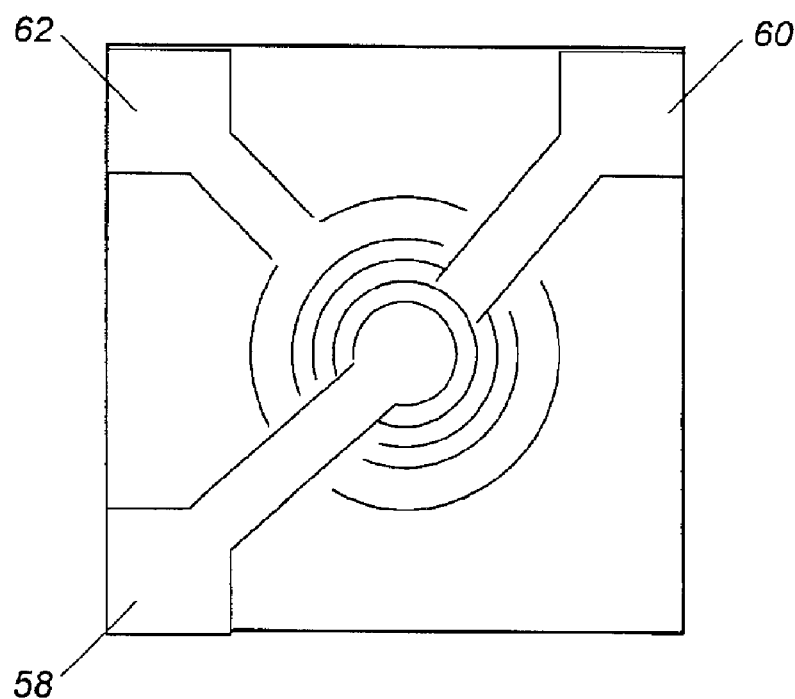
FIG. 5 is a plan view of the device illustrated in FIG. 4.

Turning to FIG. 4, the next processing level relates to depositing an n-contact metal 52 for the photodetector contact on top of the third CTO layer 50. The n-contact metal 52 is deposited and lifted off by standard photolithography and metal deposition techniques to form an n-contact for the photodetector. After the n contact 52 is formed, the photodetector is formed as a mesa using standard semiconductor processing techniques, for example, and etching through layer 42 up to layer 40. After the mesa 54 is formed, a photodetector p-type contact 58 is formed by conventional semiconductor processing techniques to form the metallization pattern 58. Subsequently, a p-metal is deposited and lifted off to form the metallization pattern 60 for the photodetector p-contact. Subsequently, an n-VCSEL metallization pattern 62 is formed. The metallization pattern 62 is formed by etching through the layer 34 and depositing and lifting of an n-type metal TiPtAu by conventional techniques, forming an integrated device.

The device may then be mounted upside down to a carrier 64, for example, as disclosed in U.S. Pat. No. 5,038,356. Subsequently, the substrate layer 22 may be lapped and polished to the desired thickness, for example, 75–100 microns. A window 66 may be formed in the bottom of the substrate 22 by standard photolithography and etching techniques. After the window 66 is formed, a p-type VCSEL contact (not shown) may be formed within the window to contact the layer 24 by standard lithography techniques.

Figure 6:
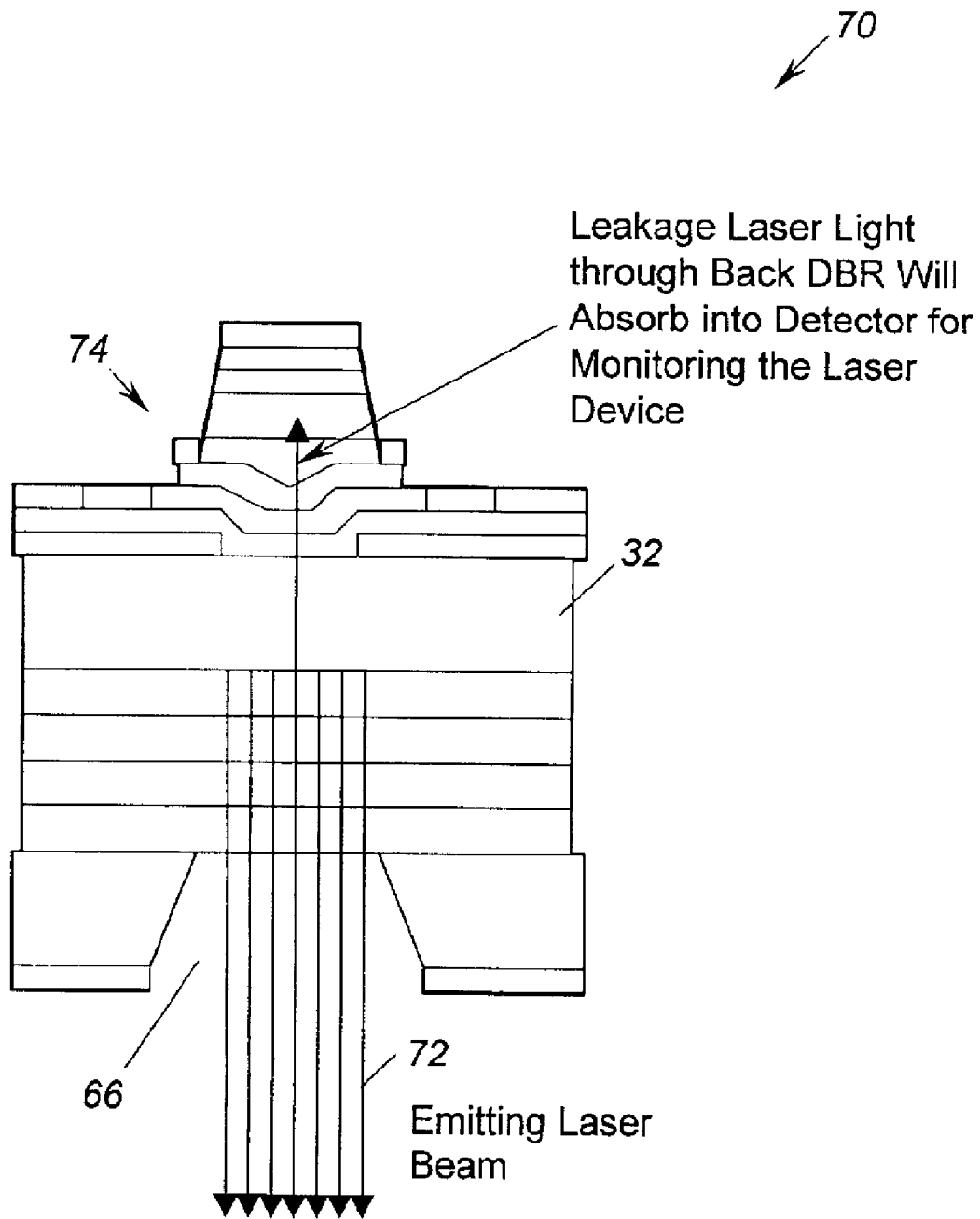
FIG. 6 is similar to FIG. 4 illustrating the operation of the photodetector in accordance with the present invention.

An exemplar integrated device is illustrated in FIG. 6 and identified with the reference numeral 70. As indicated in U.S. Pat. No. 5,038,356, the laser emits light in a direction generally perpendicular to the planar layers of the device out the window 66, as generally indicated by the arrow 72. The photodetector, generally identified with the reference numeral 74, receives leakage light back through the top reflective stack 32 and window 36, which, in turn, is absorbed into the detector 74 to provide an indication of the operation of the VCSEL integrally formed therewith.

Obviously, many modifications and variations of the present invention are possible in light of the above teachings. For example, various known photodetectors and photodiodes may be formed on top of the active or light emitting device to provide an integrated device with additional functionality in accordance with present invention. Thus, it is to be understood that, within the scope of the appended claims, the invention may be practiced otherwise than as specifically described above.

What is claimed is:

1. A semiconductor with integrated monitoring comprising;

a first light emitting semiconductor device formed on a predetermined substrate; a passivation layer formed on top of a portion of said first light-emitting semiconductor device, wherein the remaining portion of said light-emitting semiconductor device not covered by said passivation layer from a window; and a light monitoring device formed directly on top of said window defining an interface between said light monitoring device and said window for monitoring leakage light back from said first light-emitting semiconductor device through said window.

2. The semiconductor as recited in claim 1, wherein said first semiconductor device is an active device.

3. The semiconductor as recited in claim 1, wherein said predetermined substrate is a GaAs substrate.

4. The semiconductor as recited in claim 1, wherein said predetermined substrate is a InP substrate.

5. The semiconductor as recited in claim 1, wherein said predetermined substrate is a GaN substrate.

6. The semiconductor as recited in claim 1, wherein said first semiconductor device is a light emitting device.

7. The semiconductor as recited in claim 1, wherein said light emitting device is a laser.

8. The semiconductor as recited in claim 7, wherein said laser is a vertical cavity surface emitting laser (VCSEL).

9. The semiconductor as recited in claim 1, wherein said monitoring device is a light receiving device.

10. The semiconductor as recited in claim 9, wherein said light receiving device is a photodiode.

11. The semiconductor as recited in claim 9, wherein said light receiving device is a photodetector.

* * * * *